United States Patent [19]
Boswell

[11] Patent Number: 5,753,349
[45] Date of Patent: May 19, 1998

[54] DOCUMENT HAVING SECURITY IMAGE AND COMPOSITE SHEET AND METHOD FOR FORMING

[75] Inventor: David R. Boswell, Woodley, England

[73] Assignee: NovaVision, Inc., Bowling Green, Ohio

[21] Appl. No.: 735,688

[22] Filed: Oct. 23, 1996

Related U.S. Application Data

[63] Continuation-in-part of Ser. No. 541,312, Oct. 10, 1995, Pat. No. 5,643,678, which is a continuation-in-part of Ser. No. 222,283, Apr. 4, 1994, Pat. No. 5,464,690.

[51] Int. Cl.$^6$ ............................................. B32B 3/00
[52] U.S. Cl. ............... 428/195; 428/212; 428/411.1; 428/457; 428/461; 428/467; 428/484; 428/913
[58] Field of Search .................... 428/35.3, 334, 428/346, 349, 457, 458, 462, 464, 461, 484, 195, 212, 44.1, 467, 913; 427/208.2, 404, 47

[56] References Cited

U.S. PATENT DOCUMENTS

| | | |
|---|---|---|
| 4,012,552 | 3/1977 | Watts . |
| 4,215,170 | 7/1980 | Oliva . |
| 4,225,211 | 9/1980 | Abe . |
| 4,340,438 | 7/1982 | Davis . |
| 4,349,402 | 9/1982 | Parker . |
| 4,357,395 | 11/1982 | Lifshin et al. . |
| 4,378,141 | 3/1983 | Yevick . |
| 4,403,004 | 9/1983 | Parker et al. . |
| 4,469,725 | 9/1984 | Fischer et al. . |
| 4,477,312 | 10/1984 | Czichy . |
| 4,495,232 | 1/1985 | Bauser et al. . |
| 4,545,838 | 10/1985 | Minkus et al. . |
| 4,568,141 | 2/1986 | Antes . |
| 4,576,439 | 3/1986 | Gale et al. . |
| 4,582,389 | 4/1986 | Wood et al. . |
| 4,603,937 | 8/1986 | Copp . |
| 4,610,499 | 9/1986 | Chem et al. . |
| 4,629,647 | 12/1986 | Sander . |
| 4,631,222 | 12/1986 | Sander . |

(List continued on next page.)

FOREIGN PATENT DOCUMENTS

| | | |
|---|---|---|
| 145481 | 6/1985 | European Pat. Off. . |
| 201323 | 12/1986 | European Pat. Off. . |
| 420261 | 3/1991 | European Pat. Off. . |
| 3744650 | 7/1989 | Germany . |
| 2220386 | 10/1990 | United Kingdom . |
| 9108524 | 6/1991 | WIPO . |
| 9316888 | 9/1993 | WIPO . |
| 9324332 | 12/1993 | WIPO . |
| 9400803 | 1/1994 | WIPO . |

*Primary Examiner*—William Krynski
*Attorney, Agent, or Firm*—Emch, Schaffer, Schaub, & Porcello, Co., L.P.A.

[57] ABSTRACT

A foil/composite sheet which either (1) is suitable for use in directly forming a holographic image or diffraction grating image on a document substrate or (2) has a holographic image or diffraction grating image embossed in the composite sheet such that a party producing the final document may hot stamp a chip containing the holographic image directly on a substrate forming the major portion of the final document. The composite sheet is characterized in that it has a sufficient degree of transparency to permit a person viewing the holographic image or diffraction grating image of such composite sheet or chip therefrom affixed to a printed substrate to readily see the printing through the holographic image or diffraction grating image.

22 Claims, 11 Drawing Sheets

U.S. PATENT DOCUMENTS

| | | |
|---|---|---|
| 4,631,223 | 12/1986 | Sander . |
| 4,643,789 | 2/1987 | Parker et al. . |
| 4,650,533 | 3/1987 | Parker et al. . |
| 4,657,803 | 4/1987 | Pernicano . |
| 4,662,653 | 5/1987 | Greenaway . |
| 4,685,138 | 8/1987 | Antes et al. . |
| 4,701,235 | 10/1987 | Mitsam . |
| 4,717,615 | 1/1988 | Reinhart . |
| 4,720,315 | 1/1988 | Greenman . |
| 4,725,111 | 2/1988 | Weitzen et al. . |
| 4,726,706 | 2/1988 | Attar . |
| 4,728,377 | 3/1988 | Gallagher . |
| 4,758,296 | 7/1988 | McGrew . |
| 4,759,969 | 7/1988 | Sander . |
| 4,773,718 | 9/1988 | Weitzen et al. . |
| 4,778,262 | 10/1988 | Haines . |
| 4,802,758 | 2/1989 | Fabbiani . |
| 4,832,445 | 5/1989 | Haines et al. . |
| 4,837,072 | 6/1989 | Kraetschmer . |
| 4,856,857 | 8/1989 | Takeuchi et al. . |
| 4,877,710 | 10/1989 | Ishikawa . |
| 4,892,385 | 1/1990 | Webster, Jr. et al. . |
| 4,892,602 | 1/1990 | Oike et al. . |
| 4,893,887 | 1/1990 | Coates . |
| 4,900,111 | 2/1990 | D'Amato et al. . |
| 4,908,285 | 3/1990 | Kushibiki et al. . |
| 4,913,504 | 4/1990 | Gallagher . |
| 4,913,858 | 4/1990 | Miekka et al. . |
| 4,921,319 | 5/1990 | Mallik . |
| 4,933,120 | 6/1990 | D'Amato et al. . |
| 4,969,700 | 11/1990 | Haines . |
| 4,971,646 | 11/1990 | Schell et al. . |
| 4,976,799 | 12/1990 | Wood . |
| 4,978,593 | 12/1990 | Yin et al. . |
| 4,990,415 | 2/1991 | Yu . |
| 4,994,131 | 2/1991 | Edwards . |
| 5,003,915 | 4/1991 | D'Amato et al. . |
| 5,013,494 | 5/1991 | Kubo et al. . |
| 5,013,632 | 5/1991 | Weber . |
| 5,044,707 | 9/1991 | Mallik . |
| 5,053,260 | 10/1991 | Brehm . |
| 5,063,658 | 11/1991 | Wild . |
| 5,071,597 | 12/1991 | D'Amato et al. . |
| 5,083,850 | 1/1992 | Mallik et al. . |
| 5,085,514 | 2/1992 | Mallik et al. . |
| 5,087,510 | 2/1992 | Tokas et al. . |
| 5,116,548 | 5/1992 | Mallik et al. . |
| 5,128,779 | 7/1992 | Mallik . |
| 5,142,383 | 8/1992 | Mallik . |
| 5,145,212 | 9/1992 | Mallik . |
| 5,155,604 | 10/1992 | Miekka et al. . |
| 5,162,927 | 11/1992 | Moss et al. . |
| 5,164,227 | 11/1992 | Miekka et al. . |
| 5,172,250 | 12/1992 | Tsuchiya et al. . |
| 5,186,787 | 2/1993 | Phillips et al. . |
| 5,189,531 | 2/1993 | Palmer et al. . |
| 5,191,449 | 3/1993 | Newswanger . |
| 5,194,971 | 3/1993 | Haines . |
| 5,199,744 | 4/1993 | Shenton . |
| 5,237,433 | 8/1993 | Haines et al. . |
| 5,300,169 | 4/1994 | Tahara . |
| 5,464,690 | 11/1995 | Boswell . |

DOCUMENT HAVING SECURITY IMAGE AND COMPOSITE SHEET AND METHOD FOR FORMING

CROSS-REFERENCE TO RELATED APPLICATIONS

This is a continuation-in-part of application Ser. No. 08/541,312 filed Oct. 10, 1995, now U.S. Pat. No. 5,643, 678, which is a continuation-in-part of application Ser. No. 08/222,283, filed Apr. 4, 1994, now U.S. Pat. No. 5,464,690.

BACKGROUND ART

The use of holographic images, particularly on documents and credit cards for security purposes, has become extremely widespread. However, despite such widespread use, the use of holographic images is fairly expensive and generally involves the manufacture of a holographic image on a discrete chip in one operation and, in a separate operation, the adhering or laminating of such holographic chip to the intended document or article such as a stock certificate, check, or verification/identification card. U.S. Pat. No. 4,913,858, incorporated herein by reference, shows one prior art method of embossing holographic images or diffraction pattern images to a plastic film or to a plastic coating of a substrate, such as paper sheeting. It is believed that the present invention incorporates advantages not available in that or other prior art. Other patents which disclose various methods for forming holograms or diffraction grating images on substrates include U.S. Pat. Nos. 5,087,510; 4,773,718; 4,728,377 and 4,717,615.

My previous patent application Ser. No. 08/222,283, filed Apr. 4, 1994 provided new and unique articles of manufacture and a method for forming a holographic image or diffraction pattern directly on a composite sheet immediately following its being affixed to the substrate forming a major component of the finished article whether it be a security document, check, verification/identification card or other document upon which it is desired to provide a hologram or diffraction grating image. Such previous patent application also disclosed and claimed a new composite sheet and method for forming such composite sheet which may be used in directly forming a hologram or diffraction grating image on a chip of such composite sheet when such chip is affixed to the substrate of the intended finished document or article.

My previous application Ser. No. 08/541,312, filed Oct. 10, 1995 disclosed and claimed a composite sheet having a hologram or diffraction grating image embossed therein, which composite sheet can be used to transfer a selected portion (i.e., a chip) from a carrier film of polyester or other plastic to a security document or other substrate by means of a conventional flat hot stamping die or smooth faced roller die of a desired size to thereby form the finished document or other article with a holographic image or diffraction grating image permanently affixed thereto.

DISCLOSURE OF THE INVENTION

Under the present invention there is provided a new composite sheet which may be used in directly forming a diffraction grating image such as a hologram or the like on a portion of such composite sheet affixed to the substrate of the intended finished document or article characterized in that such composite sheet has a sufficient degree of transparency to permit a person viewing the diffraction grating image of a portion of such composite sheet affixed to a printed substrate to readily see the printing through the diffraction grating image. Under this embodiment, the party producing the final document has the ability to retain and maintain control of its own embossing shim on which the hologram or diffraction pattern has been formed and which is used for embossing the hologram or diffraction pattern on the document. This is in contrast to a procedure which is commonly used at present in which a chip on which the hologram or diffraction grating image has been embossed is prepared by a hologram supplier who ships only the chip to the party planning to adhere it to the document. In this latter procedure, the hologram chip supplier retains the embossing shim thus depriving the party preparing the security document of control of this critical element of its security system and introducing additional expense for the auditing and secure transportation of said chips.

Under a second embodiment, the composite sheet having such degree of transparency has a hologram or diffraction grating image embossed therein and can be used to transfer and affix a selected portion (i.e., a chip) of such composite sheet from a carrier film of polyester or other suitable plastic to a security document or other substrate by means of a conventional flat hot stamping die or smooth faced roller die of a desired size to thereby form the finished document or other article with a holographic image or diffraction grating image permanently affixed thereto such that printing which was on the substrate prior to such affixing can be viewing through the diffraction grating image.

Under the present invention a carrier film substrate having a thickness on the order of 12 microns to 50 microns and formed of a plastic material such as a polyester, oriented polypropylene or polyethylene, for example, is coated with a release coating such as a microcrystalline wax or a partially saponified montan wax or other wax based coating described herein having a thickness in the range of 0.025 microns to 5 microns and then has a coating of hard lacquer applied over the release coating in a thickness in the range of 0.5 microns to 5 microns. The hard lacquer coating may be applied by a gravure roller following which it is dried and the partially completed composite film is re-reeled. A soft lacquer coating also having a thickness in the range of 0.5 microns to 5 microns is then applied by means of a gravure roller. This portion of the composite sheet is then re-reeled. The composite sheet as thus constructed will have sufficient transparency to permit viewing therethrough, and through a holographic or diffraction grating image formed therein, of printing on a substrate to which the composite sheet or a chip therefrom is affixed. However, for some applications, it is desirable to have an extremely thin layer of metal such as aluminum applied to the soft lacquer coating by vacuum deposition or other well known applying method. The thickness of the metal layer is such as to provide a partially metalized coating as a component of the composite sheet while still having a degree of transparency which permits viewing of printing on a substrate to which the sheet or a chip therefrom is applied. Where a layer of metal is utilized, its thickness, as measured by the Macbeth Optical Density, is in the range of 0.10 to 0.50 and provides light transmission in the range of 30% to 80%. The metal layer is coated with an embossment receiving coating having thickness in the range of 0.25 microns to 1 micron. The embossment receiving coating is formed of a wax-based coating described herein. If no layer of metal is utilized, the embossment receiving coating is applied directly to the soft lacquer coating.

Other prior art patents which disclose various constructions of film or foil including ones having holograms or other three-dimensional patterns formed therein are noted as follows: 4,758,296; 4,837,072; 4,892,602; 4,856,857; 5,087,510 and 5,300,169.

It is an object of the present invention to provide a composite sheet which either (1) has a holographic or diffraction grating image formed therein which may be transferred to a substrate or (2) may be applied to a substrate and thereafter used in directly forming a hologram or diffraction grating image on the substrate of the intended finished document or article, which composite sheet is characterized in that printing on such substrate to which such composite sheet or chip therefrom is applied may be viewed through the holographic or diffraction grating image.

It is another object of the present invention to provide a document or other article on which a hologram or diffraction grating image has been directly formed or hot stamped from a composite sheet bearing such hologram or diffraction grating image characterized in that printing on the substrate of such document may be viewed through the hologram or diffraction grating image.

These and other objects of the present invention will become readily apparent from the following detailed description along with the appended drawings.

BEST MODE OF CARRYING OUT THE INVENTION

Figure 1:
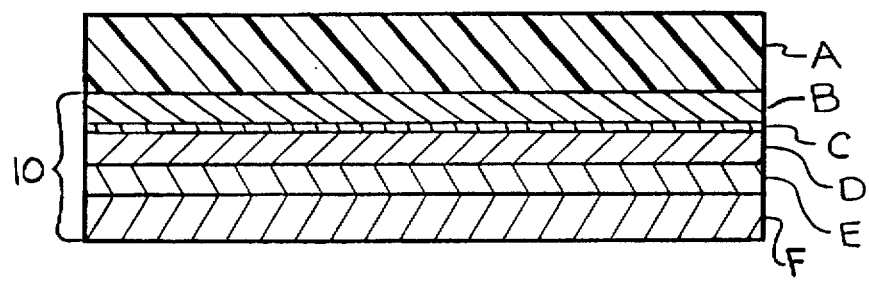
FIG. 1 is a schematic view showing a cross section of one embodiment of composite sheet affixed to a carrier film, which composite sheet may be used in applying the hologram or diffraction grating image directly to a substrate.

Referring now to FIG. 1, there is shown one construction of composite sheet which may be used for applying a hologram directly to a substrate and being sufficiently transparent to view therethrough printing on the substrate.

There is shown in FIG. 1 a composite sheet 10 affixed to a film substrate A. The film substrate A has a thickness in the range of 12 microns to 50 microns and may be formed of one of a number of different types of material including a film of polyester such as polyethyleneterephthalate or a film of biaxially oriented polypropylene, cellulose tri-acetate, polystyrene, polyethylene or polyvinylchloride. In the embodiment of FIG. 1, a release coating B of a wax such as a microcrystalline wax or a partially saponified montan wax or a siloxane having a thickness in the range of 0.025 microns to 1 micron is applied to the film substrate A. Under one embodiment on extremely thin layer of metal C is applied to the release coating B by vacuum metal deposition or sputtering or electron beam deposition. The metal layer C is preferably aluminum; however, it could be stainless steel, nichrome, gold, silver, platinum or any other metal which can be vaporized and deposited by vacuum deposition or applied by sputtering or electron beam deposition.

The thickness of the layer of metal C is sufficiently thin as to permit the transmission of light therethrough so that printing on a document substrate to which is applied a composite sheet having a layer of metal C in such thickness is visible through such composite sheet including the holographic or diffraction grating image. The thickness of such layer of metal C is such as to provide optical density in the range of 0.10 to 0.50 units as measured by the Macbeth Densitometer and is preferably between 0.20 and 0.30. The ranges of light transmission through a composite sheet of the present invention for various optical densities of the layer of metal C as measured by the Macbeth Densitometer is set forth in the following table:

| Macbeth Optical Density Units | Percent Transmission |
| --- | --- |
| 0.10 | 79.43 |
| 0.20 | 63.10 |
| 0.30 | 50.12 |
| 0.40 | 39.81 |
| 0.50 | 31.61 |

A coating D of a lacquer such as acrylic, styrene acrylonitrile, polyethyleneterephthalate or nitrocellulose is applied to the metal layer in a thickness in the range of 0.5 microns to 3 microns. The coating D is preferably a thermosoftening lacquer applied from solution and containing acrylic and/or nitrocellulose and/or chlorinated rubber.

A tie coating E is then applied to the lacquer coating D. The tie coating E is a material which is preferably the same type of material used for the lacquer coating D but a much thinner layer. The tie coating E has a thickness in the range of 0.05 microns to 0.2 microns. It has been discovered that the use of a tie coating such as the tie coating E increases the bond between the lacquer coating D and the adhesive coating F.

The final coating for the composite sheet 10 is a heat activated adhesive coating F which is formulated for its ability to adhere to the particular substrate to be used in the final document. Such final document could be a stock certificate, check or verification/identification card. Such substrate, for example, might be plain or printed paper, coated paper, a sophisticated security paper, or a plastic such as polyethyleneterephthalate, polyvinylchloride, oriented polypropylene, acetate or the like. Heat activated adhesives are well known and can be readily obtained for use in adhering to any of the above types of substrates. For example, depending on the substrate, the heat activated adhesive coating F could be a mixture of vinyl acetate, vinyl alcohol co-polymer and other heat softening resins dissolved in a mixture of ethanol and water, if intended for graphics use. The thickness of the heat activated adhesive coating may be in the range of 0.75 microns to 4 microns.

The purpose of the tie coating E is to increase the bond between the lacquer coating D and the adhesive coating F. However, as will be apparent for the various modifications to be disclosed herein, the tie coating E may be omitted.

Figure 2:
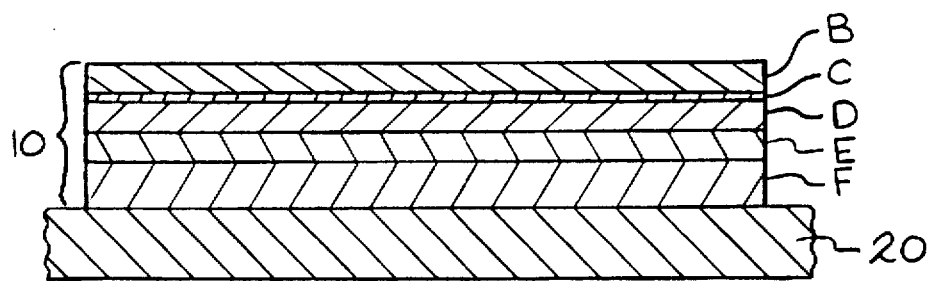
FIG. 2 is a view similar to FIG. 1 but showing the composite sheet removed from the carrier film and adhered to the substrate of the intended finished document or other article.
Figure 3:
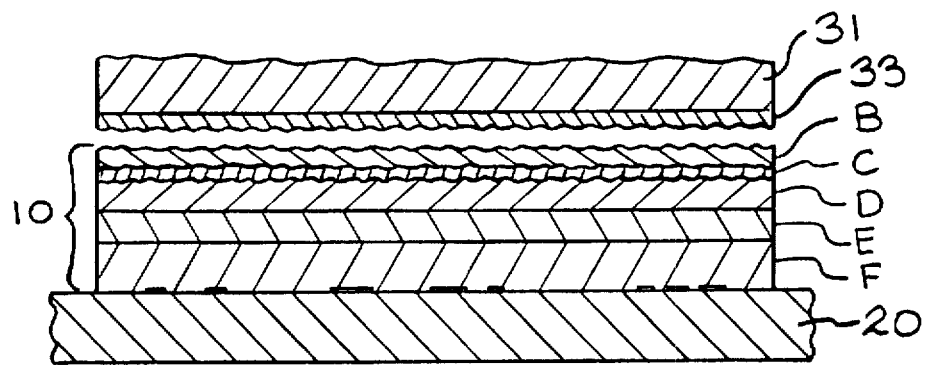
FIG. 3 is a schematic view showing a cross section of the finished article with the hologram or diffraction grating image embossed in the surface opposite the substrate.

FIG. 2 shows schematically the construction following the next step of the method. In FIG. 2 there is shown the composite sheet 10 removed from the film substrate A and adhered to a document substrate 20, with the heat activated adhesive coating F facing and adhered to such document substrate 20. Removal of the film substrate A leaves the composite sheet 10 with the release coating B exposed. The document substrate 20 may be of any desired material to which the heat activated adhesive may adhere including but not limited to paper, printed or security paper, coated paper or a wide variety of plastic film or sheet such as those used for the film substrate A and is shown as having printing PR thereon. In FIGS. 2 and 3, the printing PR is shown greatly exaggerated in order to illustrate its presence. For example, if the desired final document is a security document such as a stock certificate, the document substrate 20 will be printed security paper. If the final intended document is a verification/identification card, the document substrate will usually be a plastic material.

Referring to FIG. 3, a chip 10' from the composite sheet 10 adhered to the document substrate 20 forming the primary portion of the final document 25 has had embossed into the release coating B, metal layer C and lacquer coating D the holographic image or diffraction pattern which has been embossed therein by a die or stamping head 31 carrying an embossing shim 33.

Figure 4:
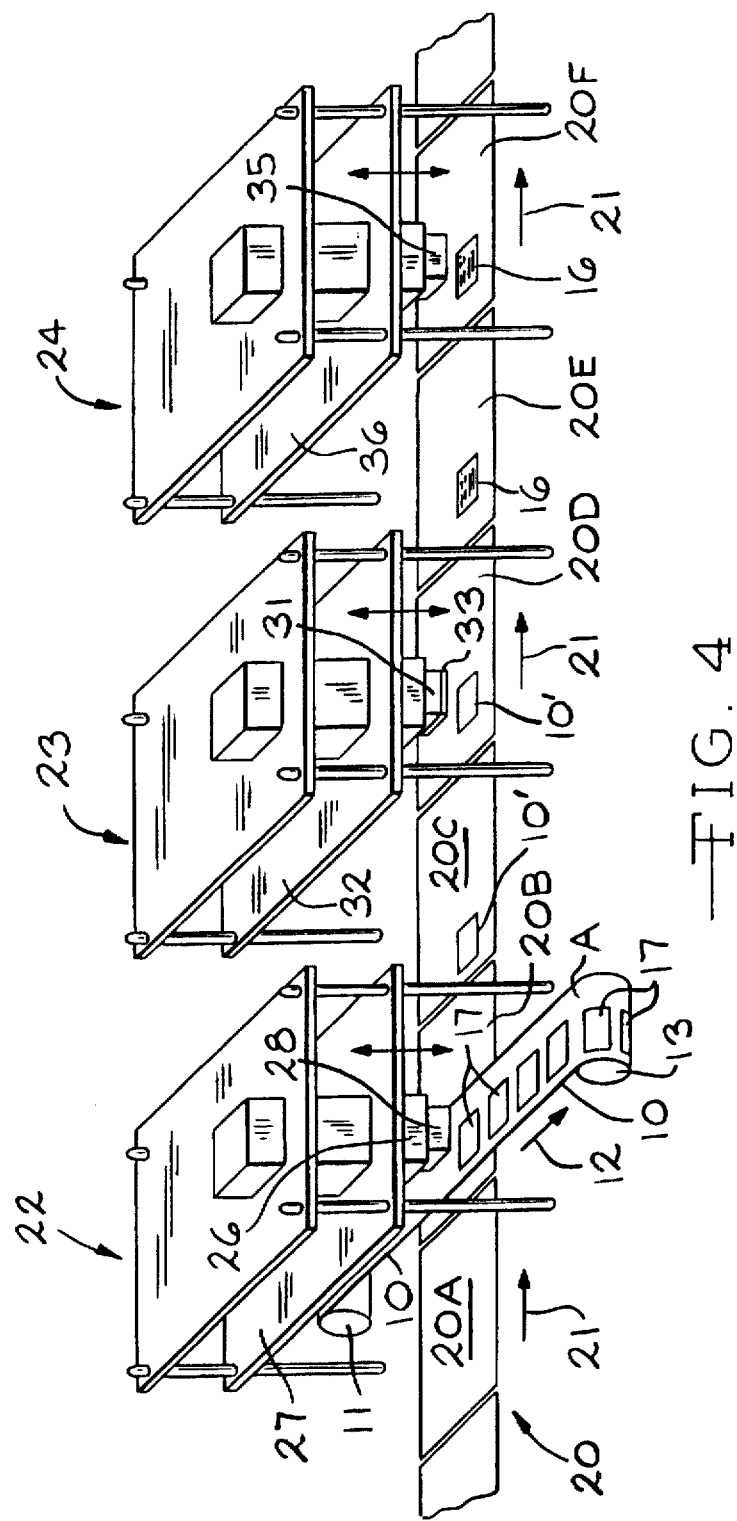
FIG. 4 is a schematic view showing one type of apparatus for forming a hologram or diffraction grating image directly upon the composite sheet of FIG. 1 or a chip portion thereof adhered to a substrate forming the main portion of the final document.

Referring now to FIG. 4, there is shown schematically one apparatus and process for successively hot stamping small areas of the composite sheet 10 to the document substrate 20 thereby leaving a small portion of composite sheet 10 which may be characterized as a chip 10' having an area the size of the stamping head adhered to the document substrate 20 and thereafter embossing the holographic image or diffraction grating image on the chip 10' and into the release coating B, metal layer C and lacquer coating D to form the final document. As shown, the substrate 20 is a continuous strip containing a series of discrete, interconnected sections 20A, 20B, 20C, 20D, 20E and 20F, etc., and is fed along a horizontal path from a supply roll (not shown) to a take-off station (not shown). The sections 20A, 20B, 20C, 20D, 20E, and 20F, etc., may having printing and constitute the major portions of finished documents with a holographic image or diffraction grating image to be embossed thereon. For example, there is shown in FIG. 6 a document 25 having a security holographic or diffraction grating image 16 to prevent counterfeiting, such as stock certificates or checks for example, or any other desired document upon which it is desired to have embossed a diffraction grating image or a hologram.

Figure 6:
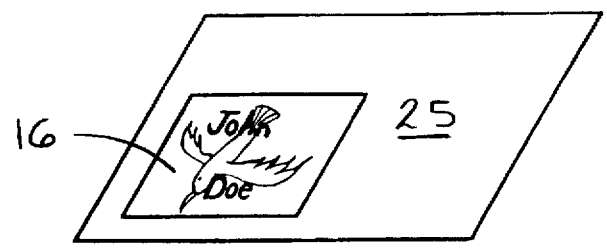
FIG. 6 is a perspective view of a finished document manufactured according to the present invention.

As shown in FIGS. 3 and 6, the final document 25 includes the substrate 20 having printing PR thereon and a chip 10' to which a holographic image 16 has been embossed. The chip 10' has been affixed over the printing PR and the printing PR is readable through the holograph or diffraction grating image 16.

The document substrate 20 could be formed of various types and qualities of paper, including papers coated with a wide variety of plastics or other materials, security paper or a film of plastic such as polyethyleneterephthalate, polyvinylchloride, oriented polypropylene, polyethylene, acetate or the like. The interconnected sections 20A, 20B, 20C, 20D, 20E and 20F, etc., will be fed with the printing PR facing upward so that the security hologram with affixed to overlay the printing PR. The continuous strip of document substrate 20 is fed in the generally horizontal path in a first direction denoted by the arrows 21 beneath a stamping station 22 and, thereafter, beneath an embossing station 23. If desired, it may also be fed through a protective overlay station 24.

The composite sheet 10, while affixed to the film substrate A, is fed from a supply roll 11 beneath the stamping station 22, over the document substrate 20 and in closely adjacent relationship thereto. The combination composite sheet 10 and film substrate A is fed in a second direction indicated by the arrow 12 at substantially 90° angle to the first direction 21. The composite sheet 10 is positioned with the heat activated layer F contacting the document substrate 20 and the film substrate A facing up or away from the document substrate 20. The film substrate A and the portions of the layers B, C, D, E and F of the composite sheet 10 not transferred to the document substrate 20 are taken up by a take-up roll 13.

The stamping station 22 is provided with a hot stamping head 26 carrying a die 28 and, directly thereunder a flat support plate (not shown). The hot stamping head 26 and die 28 are maintained at a temperature in the range of 75° C. to 250° C. and are mounted on a platform 27 for movement between a raised position shown in FIG. 4 and a lowered position. When the platform 27 is in a lowered position, the die 28 engages the film substrate A, heating it and the composite sheet 10 to a temperature in the range of 75° C. to 250° C. and urging the composite sheet 10 against the underlying section of substrate 20 and against the support plate. In FIG. 4, the underlying section is 20B. Immediately prior to engagement of the die 28 to the against the film substrate A, the composite sheet 10 with the film substrate A and the continuous strip of document substrate 20 are caused to briefly stop, with movement resuming when the head 26 and die 28 are raised.

As a result of the heat and pressure to which the film substrate A and composite sheet 10 and the successive sections of document substrate 20 are subjected by clamping between the die 28 and the support plate, the heat activated adhesive layer F is caused to become adhered to the specific section of the document substrate so engaged, section 20B, as shown in FIG. 4. At the same time, the heat causes the release coating B of the composite sheet 10 to separate from the film substrate A with the result that the section 20B has affixed thereto a chip 10' portion of the composite sheet 10 constituting the release coating B, the metal layer C, the lacquer coating D, the tie coating E and the heat activated adhesive F in a size corresponding to the size of the hot stamping head 26. The die 28 is flat in order to provide substantially uniform heat and pressure to the underlying portion of the composite sheet 10 and section 20B during the stamping operation and thus ensure uniform adhesion of the adhesive layer F to the section 20B and uniform release of the release coating B from the film substrate A. The hot stamping head 26 and die 28 should be maintained at a temperature in the range of 75° C. to 250° C. in order to bring the contacted portion of the composite sheet 10 to such temperature range. As may be seen in FIG. 4, those portions of the film substrate A and composite sheet 10 which were subjected to heat and pressure by the die 28 appear as a series of windows 17 containing only the film substrate A while the remaining portions being taken up by the take-up roll 13 consist of the film substrate A and all layers of the original composite sheet 10, namely, B, C, D, E and F.

After leaving the stamping station 22, the sections 20B, 20C, 20D, etc., are moved to the embossing station 23 carrying with them the stamped chips 10' of the composite sheet 10 consisting of layers B, C, D, E and F with the layer F being the heat activated adhesive which is now adhered to the face o the sections 20C and 20D as shown in FIG. 4.

The embossing station 23 includes a heated stamping head 31 mounted on a platform 32 moveable between a raised position shown in FIG. 4 to a lowered position at which the heated stamping head 31 contacts the section 20D. The heated stamping head 31 carries an embossing shim 33 bearing the diffraction grating image or, in the case of security documents, preferably, a holographic image. When the section 20D is positioned beneath the heated stamping head 31 in a position in which the stamped chip 10' of such section 20D is aligned to be contacted by the heated stamping head 31 and embossing shim 33, the platform 32 will be lowered to cause the embossing shim 33 carried by the heated stamping head 31 to engage the stamped chip 10' which was adhered to the section 20D at the stamping station 22. A support plate (not shown) is positioned beneath the heated stamping head 31. Upon lowering of the platform 32, the stamped chip 10' of the section 20D is compressed between the embossing shim 33 secured to the heated stamping head 31 and the flat support plate thereby embossing the holographic pattern or diffraction grating image carried by such embossing shim 33 into the upper surface of the chip 10'. The heated stamping head 31 and the embossing shim 33 are maintained at a temperature in the range of 75° C. to 250° C. The image carried by the embossing shim 33 will be embossed into the release coating B and the metal layer C and to some extent into the lacquer coating D forming holographic image 16 or diffraction grating image. The platform 32 is then raised and the continuous strip with the sections 20A, 20B, 20C, 20D, etc., moved with the completed holographic image 16 on section 20D to a position indicated by section 20E. The section 20E with the holographic image 16 or diffraction grating image embossed therein may then be cut from the continuous strip thus forming the final document 25 as shown in FIG. 6.

However, in many instances it is desirable to provide a protective coating layer to the holographic image 16 for increased abrasion resistance. In this case the section 20E as well as the other sections 20F, etc., remain uncut from the continuous strip and are moved into a protective overlay station 24. As shown in FIG. 4, section 20F is positioned at the protective overlay station 24 with its holographic image 16 positioned beneath a head 35 carrying overlay lacquer suitable for providing an abrasion resistant coating to the holographic image 16. The head 35 is mounted on a platform 36 moveable between a raised position shown in FIG. 4 to a lowered position in which the head 35 may engage and apply the protective coating layer to the holographic image 16. Preferably, a back up late (not shown) is positioned beneath the head 35. Following application of the protective coating layer, the section may be cut from the continuous strip thus forming the final document 25 shown in FIG. 6.

Figure 7:
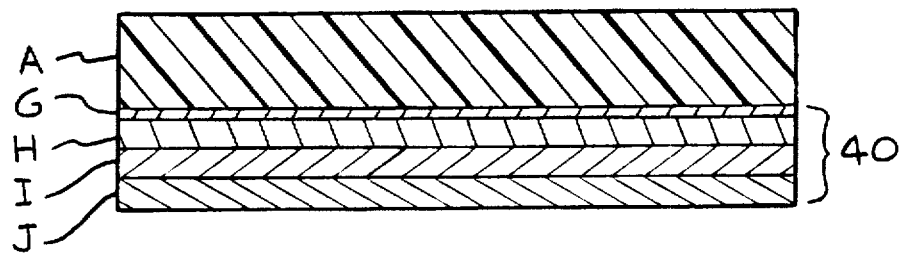
FIG. 7 is a schematic view showing a cross section of a second embodiment of composite sheet affixed to a carrier film, which composite sheet may be used in applying the hologram or diffraction grating image directly to a substrate.

Referring now to FIG. 7, there is shown a further embodiment in which there is provided a film substrate A and a composite sheet 40 having a slightly modified construction from that of the first embodiment of composite sheet 10. The construction of the composite sheet 40 is similar to that of the composite sheet 10 with the exception that there is no release coating between the film substrate to be released following application to the document and the metal layer. Thus, the composite sheet 40 consists of a layer G of metal, a coating H of lacquer, a tie coating I and a layer J of heat activated adhesive. The metal layer G is extremely thin, having a thickness such as to provide optical density in the range of 0.10 to 0.50 units as measured by the Macbeth Densitometer. The metal layer G may be applied by vacuum metal deposition, sputtering, or electron beam deposition and is preferably aluminum; however, it could be stainless steel, nichrome, gold, silver, platinum or any other metal which can be vaporized and deposited by vacuum deposition or applied by sputtering or electron beam deposition. It has been discovered that, although a release coating such as that utilized in the embodiment of FIG. 1 may be used, its presence is not absolutely necessary and, in fact, there may be some benefits in not utilizing such a release coating. it has been found that there is a natural tendency for the metal layer G to be rejected from the plastic film substrate A with the result that it along with the other layers of the composite sheet 40 of the embodiment of FIG. 7 may be readily separated from the film substrate A following the stamping operation at the stamping station 22. The remaining layers of the embodiment of FIG. 7 are identical to the final three layers of the embodiment of FIG. 1 with the coating H of lacquer being a member of the group of acrylic, styrene acrylonitrile, polyethyleneterephthalate or nitrocellulose applied to the metal layer G in a thickness in the range of 0.5 microns to 3 microns. Preferably, the lacquer is a thermosoftening lacquer applied from solution and containing acrylic and/or nitrocellulose and/or chlorinated rubber.

The tie coating I applied to the lacquer coating H is similar to the tie coating E of the embodiment of FIG. 1.

The layer J of heat activated adhesive is applied to the tie coating I and, as in the previous embodiment, the heat activated adhesive is one which may vary depending upon the specific type of substrate to be used for the document substrate 20 to which the chips 10' are to be applied and the holographic image or diffraction grating image is to be embossed.

Figure 8:
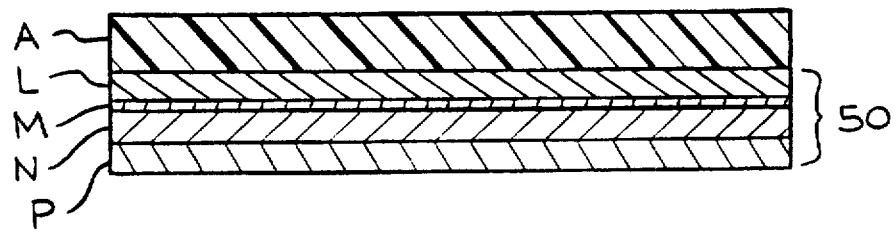
FIG. 8 is a view similar to FIG. 7 showing yet another embodiment of composite sheet affixed to a carrier film.

Referring now to FIG. 8, there is shown another embodiment having a slightly different construction of composite sheet 50 affixed to the film substrate A. This embodiment is similar to the embodiment of FIG. 1 with the exception that there is no tie coating between the lacquer coating and the heat activated adhesive. Thus, in the embodiment of FIG. 8, there is provided a film substrate A to which the composite sheet 50 is affixed.

The composite sheet 50 incudes a release coating L of a wax or siloxane having a thickness in the range of 0.025 microns to 1 micron applied to the film substrate A. The wax is preferably a microcrystalline wax or a partially saponified montan wax. A very thin layer M of metal having a thickness such as to provide optical density in the range of 0.10 to 0.50 units on the Macbeth Densitometer is applied to the release coating L in the manner previous described.

A coating N of lacquer of the type previously described is applied to the metal layer M in a thickness in the range of 0.5 microns to 3 microns.

Applied directly to the lacquer coating N is a heat activated adhesive coating P which, as in the previous embodiments, will vary depending upon the type of substrate to be used in the final document.

Figure 9:
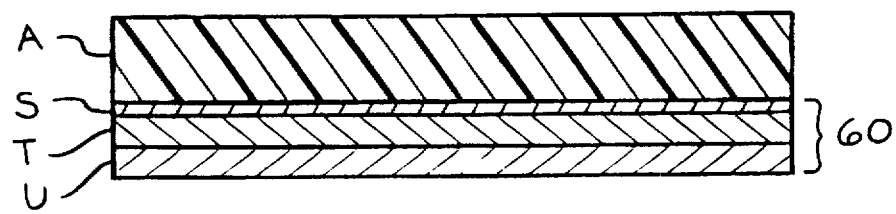
FIG. 9 is a view similar to FIG. 7 showing still another embodiment of composite sheet affixed to a carrier film.

Referring now to FIG. 9, there is shown another embodiment of composite sheet 60 affixed to a film substrate A. According to this embodiment, there is neither a release coating nor a tie coating. Thus, in the embodiment of FIG. 9, the composite sheet 60 comprises a metal layer S which is applied directly to such film substrate A. The metal layer S is the same as that utilized for the metal layer B in the embodiment of FIG. 1. A lacquer coating T such as that previously described is applied to the metal layer S in a thickness in the range of 0.5 to 3 microns. Applied directly to the lacquer coating T is a heat activated adhesive coating U which is similar to the coating F of the embodiment of FIG. 1 and will vary depending upon the type of material used for the final document.

A significant advantage of the embodiments of FIGS. 7 and 9 resides in the fact that the embossed hologram or diffraction grating image contained on the embossing shim 33 will be embossed directly onto the metal layer G in the case of the embodiment of FIG. 7 or the metal layer S in the case of the embodiment of FIG. 9. The embossed hologram or diffraction grating image will extend into the lacquer coating H of the embodiment of FIG. 7, the lacquer coating N of the embodiment of FIG. 8 and the lacquer coating T of the embodiment of FIG. 9.

Figure 5:
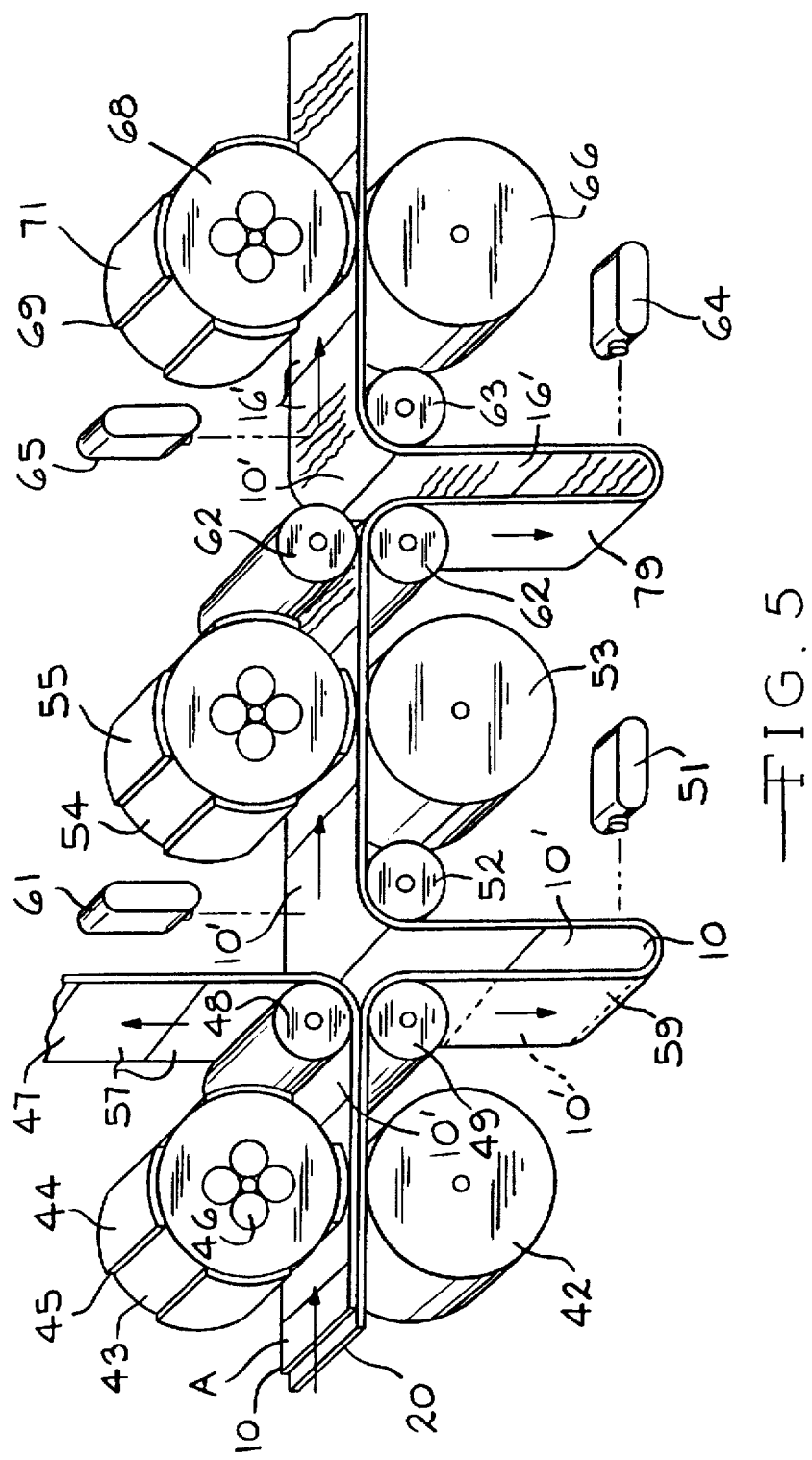
FIG. 5 is a schematic view showing another type of apparatus for directly applying a hologram or diffraction grating image to a substrate.

Referring now to FIG. 5, there is shown a modified apparatus for applying a chip 10' of the composite sheet 10 to the document substrate and embossing directly therein the holographic image or diffraction grating pattern to form the final document on a continuous basis. As shown in FIG. 5, the document substrate 20 and the film substrate A with the affixed composite sheet 10 are fed in surface to surface engagement between a nip roller 42 and a heated metal roller 43 having aluminum or other type of metal dies 45 which are intermittently spaced around the circumference of the metal roller 43 and which may, if desired, have a silicon rubber 44 thereon. The adhesive layer F of the composite sheet 10 is facing and in contact with the document substrate 20. The nip roller 42 may be metal or a metal with a silicon rubber coating and is maintained at ambient temperature. The metal roller 43 is heated as by internal cartridge heaters 46. The internal cartridge heaters may reach a temperature up to 400° C. and heat the aluminum dies 45 such that the temperature of the surface of the silicon rubber 44 is maintained at a temperature between 75° C. and 250° C.

As the combination film substrate A and composite sheet 10 and the document substrate 20 are fed together between the nip roller 42 and the metal roller 43, those portions of the composite sheet 10 which are subjected to heat and pressure between the aluminum dies 45 with their silicon rubber 44 and the nip roller 42 are caused to be released from the film substrate A such that a chip 10' consisting of the release coating B and the remaining layers C, D, E and F is adhered to the document substrate 20. A chip 10' is stamped to the document substrate 20 by each of the aluminum dies 45 with their silicon rubber thus forming a series of intermittent stamped chips 10'. That portion of the film substrate A and those portions of the composite sheet 10 not contacted by the aluminum dies 45 are removed as a continuous strip of waste material 47 by being separated from the document substrate 20 after passing through a pair of drive shafts 48 and 49. Those portions of the film substrate A and composite sheet 10 which were contacted by the aluminum dies 45 appear on the strip of waste material 47 as a series of windows 57 containing only the film substrate A.

The document substrate 20 with intermittent chips 10' adhered thereto under heat and pressure by the aluminum dies 45 with the silicon rubber 44 is moved around the lower driveshaft 49 downwardly to form a loop 59 the length of which is controlled by an optical sensor 51. It is then fed over a vacuum advance roller 52 so that it moves in a horizontal direction between a nip roller 53 and an embossing roller 54 having spaced apart embossing shims 55 on which have been formed the holographic image or the diffraction grating image. The vacuum advance roller 52 pushes the document substrate 20 with the chips 10' adhered thereto between the rollers 53 and 54. An optical sensor 61 is provided to provide appropriate registration such that the stamped chips 10' which are now on the upper surface of the document substrate 20 are registered to be engaged by the embossing shims 55. The embossing shims 55 will engage the release coating layer B and thus emboss therein and in the metal layer C and the lacquer coating layer D the holographic image 16' or diffraction grating image carried by the embossing shim 55. At this point, the final document could be trimmed from the web. However, if it is desired to provide a protective overlay over the hologram, the web with the intermittent chips 10' stamped with the holographic image 16' may be passed between a pair of free wheeling rollers 62 and directed downwardly from a loop 79, with the length of the loop 79 being determined by an optical sensor 64. The document substrate 20 with the holographic images 16' is then passed over a vacuum advance roller 63 along a horizontal plane beneath another optical sensor 65 which registers the chips 10' including the holographic images 16' with the coating die. The document substrate 20 is pushed by the vacuum advance roller 63 between a nip roller 66 of metal or metal with a silicon rubber coating and maintained at ambient temperature and a heated roller 68 having aluminum dies 69 carrying a head 71 for applying the protective layer to the chips 10' bearing the holographic images 16'. Following application of the protective layer, the sections may be cut to the appropriate length thereby forming the final document similar to the one shown in FIG. 6.

Figure 10:
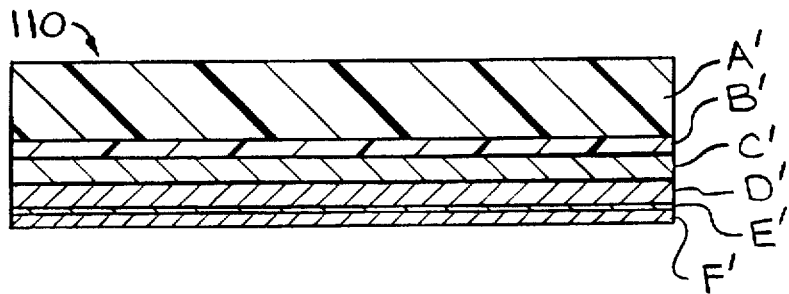
FIG. 10 is a schematic view showing a cross section of a further embodiment of composite sheet showing the various layers of structure suitable for having embossed thereon a holographic image or diffraction grating image.

Referring now to FIG. 10, there is shown a composite sheet 110 constructed according to another embodiment of the present invention, which composite sheet may have applied thereto a holographic image or other diffraction grating image. The composite sheet 110 comprises six layers including a support film substrate A'. The film substrate A' has a thickness in the range of 12 microns to 50 microns and may be formed of one of a number of different types of material including a film of polyester such as polyethyleneterephthalate or a film of biaxially oriented polypropylene, cellulose tri-acetate, polystyrene, polyethylene or polyvinylchloride. In one example, the substrate was a polyester film having a thickness of 12 microns obtained from ICI Films, Wilmington, Del. (Product I.D. Melinex HS-2). A release coating B' of a wax such as a microcrystalline wax or a montan wax or a siloxane having a thickness in the range of 0.025 microns to 5 microns is applied to the film substrate A'.

A coating C' of a hard lacquer such as polymethyl methacrylate, styrene acrylonitrile, polyethyleneterephthalate or nitrocellulose is applied to the release coat in a thickness in the range of 0.5 microns to 5 microns.

A soft lacquer coating D' is then applied to the hard lacquer coating C'. The soft lacquer coating D' is a thermosoftening lacquer containing acrylic and/or nitrocellulose and/or chlorinated rubber. The soft lacquer coating D' has a thickness in the range of 0.5 microns to 5 microns. A soft lacquer coating is one which has a lower softening/glass transition temperature relative to a hard lacquer coating which has a higher softening/glass transition temperature. The specifics of the soft lacquer and the differences between it and the hard lacquer will be described in example hereinafter set forth.

Under one aspect of this embodiment, an extremely thin layer of metal E' is applied to the soft lacquer coating D' by vacuum metal deposition or sputtering or electron beam deposition. The metal layer E' is preferably aluminum; however, it could be stainless steel, nichrome, gold, silver, platinum or any other metal which can be vaporized and deposited by vacuum deposition or applied by sputtering or electron beam deposition and has a thickness such as to provide optical density in the range of 0.10 to 0.50 units as measured by Macbeth Densitometer and is preferably between 0.20 and 0.30.

The final coating for the composite sheet is an embossment receiving coating F' which has a thickness in the range of 0.025 micron to 1 micron and is formed of a montan wax base. The embossment receiving coating F' in one example was formed of an esterfied montan wax obtained from Hoechst A. G., Augsburg, Germany (Product identification Hoechst OP) dissolved in toluene which was combined with aluminum stearate obtained from Whitaker, Clark and Daniels, South Plainfield, N.J. (Product I.D. #909). Twenty-five grams of aluminum stearate was dissolved in 1.14 liters of toluene by heating and/or stirring. When dissolved, the solution is further heated to 65° C. until a firm gel forms. Separately, 30 grams of the esterfied montan wax was dissolved in 1.14 liters of toluene by heating and/or stirring until a clear solution was formed. The clear solution was then added to the gel and stirred to form a mixture which was thereafter added to 36.3 liters of toluene. Finally, 9 grams of ethyl cellulose was added to such mixture and stirred for 20 minutes. The embossment receiving coating F' was applied to the metal layer E' of the partially formed composite sheet consisting of a polyester substrate A', release coating B', hard lacquer layer C', soft lacquer layer D' and metal layer E'.

The coating material thus formed for the embossment receiving coating F' was also used for the release coating B'. However, the release coating could also be a siloxane or a microcrystalline wax.

The coating C' of hard lacquer was formed of 2.4 kilograms of imide modified acrylic obtained from Rohm and Haas under its product identification QR-1381 and 4.8 kilograms cellulose nitrate obtained from Hercules, Inc. under its product identification RS 18-25. These were mixed with 27.3 liters of methyl ethyl ketone and 2.3 liters of xylene. These were dissolved by fast stirring and then were thinned by providing one part of the above formulation in 72 parts of methyl ethyl ketone.

The soft lacquer coating D' was formed by mixing 10 kilograms of polymethyl methacrylate obtained from Rohm and Haas (Product I.D. Acryloid B-99) and 20 kilograms of cellulose nitrate obtained from Hercules, Inc., Wilmington, Del. (Product I.D. RS 18-25) and dissolving the mixture by high speed stirring in 90.8 liters of methyl ethyl ketone and 9.03 liters of xylene. The soft lacquer coating D' has a glass transition temperature (Tg) of 62° to 68° C. The hard lacquer coating C' has a glass transition temperature (Tg) of approximately 82° C.

Figure 11:
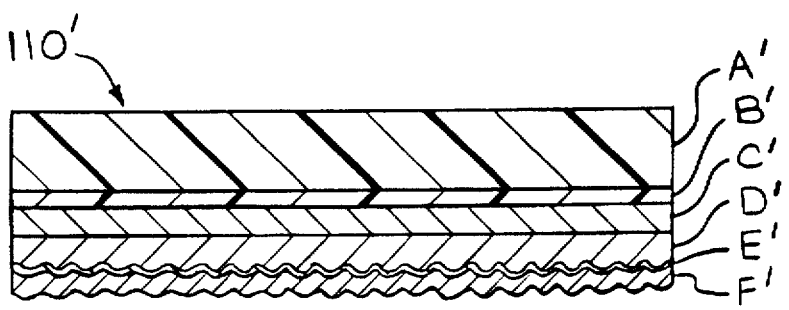
FIG. 11 is a view showing the composite sheet of FIG. 10 with a holographic image or diffraction grating image embossed into the embossment receiving layer, the layer of aluminum or other metal and the layer of soft lacquer and showing an embossed metal shim spaced therefrom following the step of embossing the composite sheet.
Figure 11:
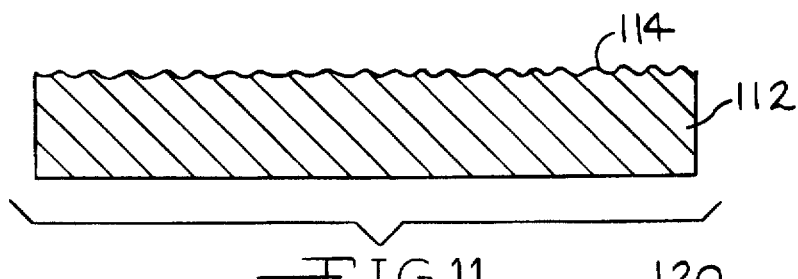

As shown schematically in FIG. 11, the composite sheet 110 as thus constructed has a holographic or diffraction grating image embossed into the embossment receiving coating F', the metal layer E' and the soft lacquer D'. The embossing of such holographic image or diffraction grating image into the three layers consisting of the embossment receiving coating F', the metal layer E' and the soft lacquer coating D' is accomplished by applying a nickel shim 112 or other suitable shim having a holographic or diffraction grating image 114 formed thereon. Such embossing is carried out under heat and pressure with the shim being applied to the embossment receiving coating F' side of the composite sheet 110. Desirably, the shim 112 will be maintained at a temperature in the range of 100° C. to 250° C. and preferably about 175° C. and applied to the composite sheet 110 under a pressure of 200 to 400 pounds per linear inch with the result that the holographic or diffraction grating image will extend into the embossment receiving layer F', the layer of metal E' and the soft lacquer coating D' thereby forming an embossed composite sheet 110'. The shim 112 may be maintained at a temperature in the range of 100° C. to 250° C. The application pressure may be in the range of 200 to 400 pounds per linear inch. With the embossing step being performed under the above temperature and pressure parameters, the layer of hard lacquer C' will serve to insulate and thereby prevent activation of the release coating B' with the result that the substrate A' will remain adhered to the remaining layers of the embossed composite sheet 110' and not be prematurely separated therefrom.

Figure 12:
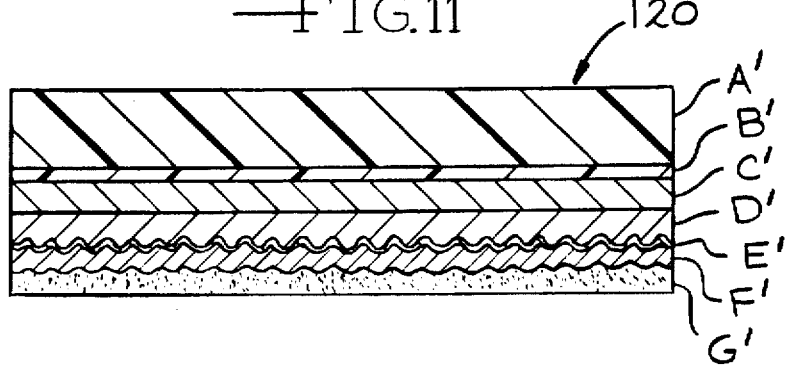
FIG. 12 is a sectional view of the embossed composite sheet of FIG. 11 with a heat activated adhesive coating applied to the embossment receiving layer.

Thereafter, as may be seen in FIG. 12, a coating of heat activated adhesive G' is applied over the embossment receiving coating F' and the embossed holographic or diffraction grating image. The heat activated adhesive coating G' serves a dual function of protecting the embossed holographic or diffraction grating image and functioning, at a later time, to adhere a chip from the embossed composite sheet 110' bearing the holographic or diffraction grating image to a desired substrate. The application of the heat activated adhesive coating G' completes the construction of a final holographic composite sheet 120.

The heat activated adhesive coating G' is formulated for its ability to adhere to the particular substrate to be used in the final document. Such final document could be a stock certificate, check or verification/identification card. Such substrate, for example, might be printed plain or coated paper, a sophisticated security paper, or a plastic such as polyethyleneterephthalate, polyvinylchloride, oriented polypropylene, acetate or the like. Heat activated adhesives are well known and can be readily obtained for use in adhering to any of the above types of substrates. The thickness of the heat activated adhesive coating may be in the range of 0.75 microns to 4 microns.

In one example a heat activated adhesive coating was formed by first formulating an adhesive base consisting of 3.6 kilograms of polyvinyl butyrate obtained from Monsanto Chemical Co., St. Louis, Mo., (Product I.D. Butuar B-90) with 4.5 kilograms polyvinyl acetate multipolymer obtained from Monsanto (Product I.D. Gelva 269) and 12.5 kilograms of acrylic emulsion obtained from Harlow Chemicals under its product Emultex AC430. Such formulation was mixed with 27.3 liters of tap water and 90.8 liters of industrial ethanol. 450 grams of a brown die was added for identification purposes.

The mill charge was formed by mixing 7 kilograms of polyvinyl chloride (PVC) resin obtained from Union Carbide Corp., New York, N.Y. (Product I.D. VMCH) and 1.1 kilograms of cellulose nitrate obtained from Hercules, Inc. (Product I.D. RS 18-25) with 23.9 liters of industrial ethanol. These were mixed under a stirrer for 10 minutes and then ball milled for 6 to 8 hours after which 9 liters of industrial ethanol was added and the mixture further ball milled for an additional 10 minutes to form a mill charge mixture. 36.6 liters of the adhesive base had added thereto 2 kilograms of titanium dioxide obtained from E.I. du Pont DeNemours & Co., Wilmington, Del. (Product No. Ti-pure R-900) and was then mixed with the mill charge mixture to form the adhesive used in adhesive layer G'.

A significant advantage of the composite sheet 110 and the method of forming an embossment in the sheet lies in the fact that the embossing shim 112 which is formed of nickel or other suitable material does not come in direct contact with the layer of aluminum E' or other metal. As a result, the shim 112 is protected against contamination which may occur in those embossing operations in which the shim 112 is in direct contact with the metal layer. Thus, the embossment coating F' serves to protect the shim 112 from making direct contact with the layer of metal E' but is sufficiently soft to permit the embossment image 114 to extend therethrough, through the layer of metal E' and into the soft lacquer coating D'. As a result, the life of shims used in forming the holographic or diffraction grating image embossments is greatly extended over the life of similar shims which form embossments by direct contact with a metal layer such as the metal layer E'.

Apparatus which may be utilized to emboss a holographic image or diffraction grating image into the composite sheet 110 to thereby form the image containing composite sheet 110' shown in FIG. 11 is described in my co-pending application Ser. No. 08/541,312 filed Oct. 10, 1995 which is incorporated herein by reference.

Figure 13:
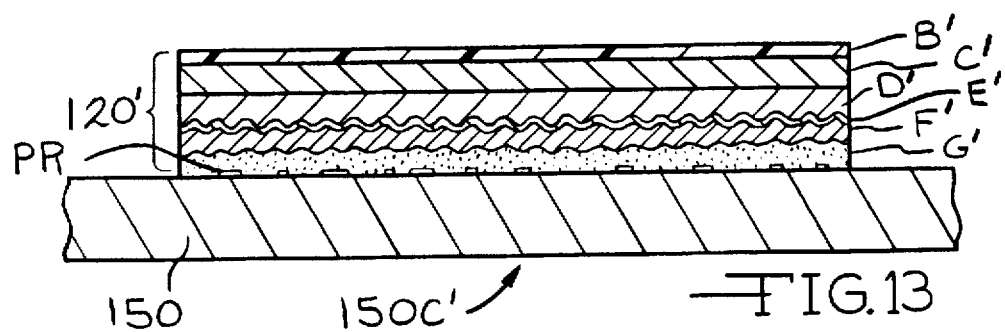
FIG. 13 is a sectional view showing the structure of a final document with a chip bearing the holographic or diffraction grating image from the composite sheet and adhesive of FIG. 12 adhered thereto.
Figure 13A:
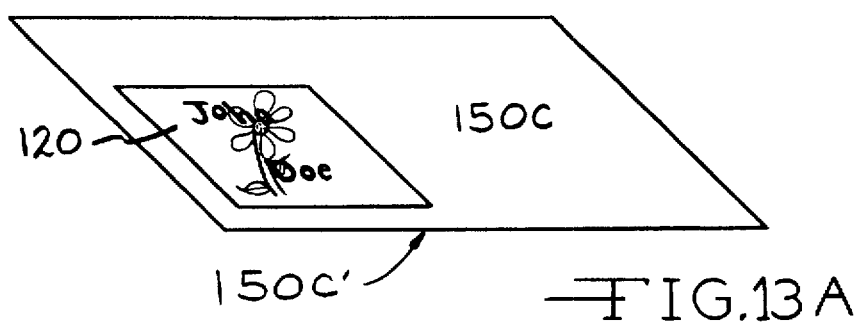
FIG. 13A is a perspective view of the finished document of FIG. 13.
Figure 14:
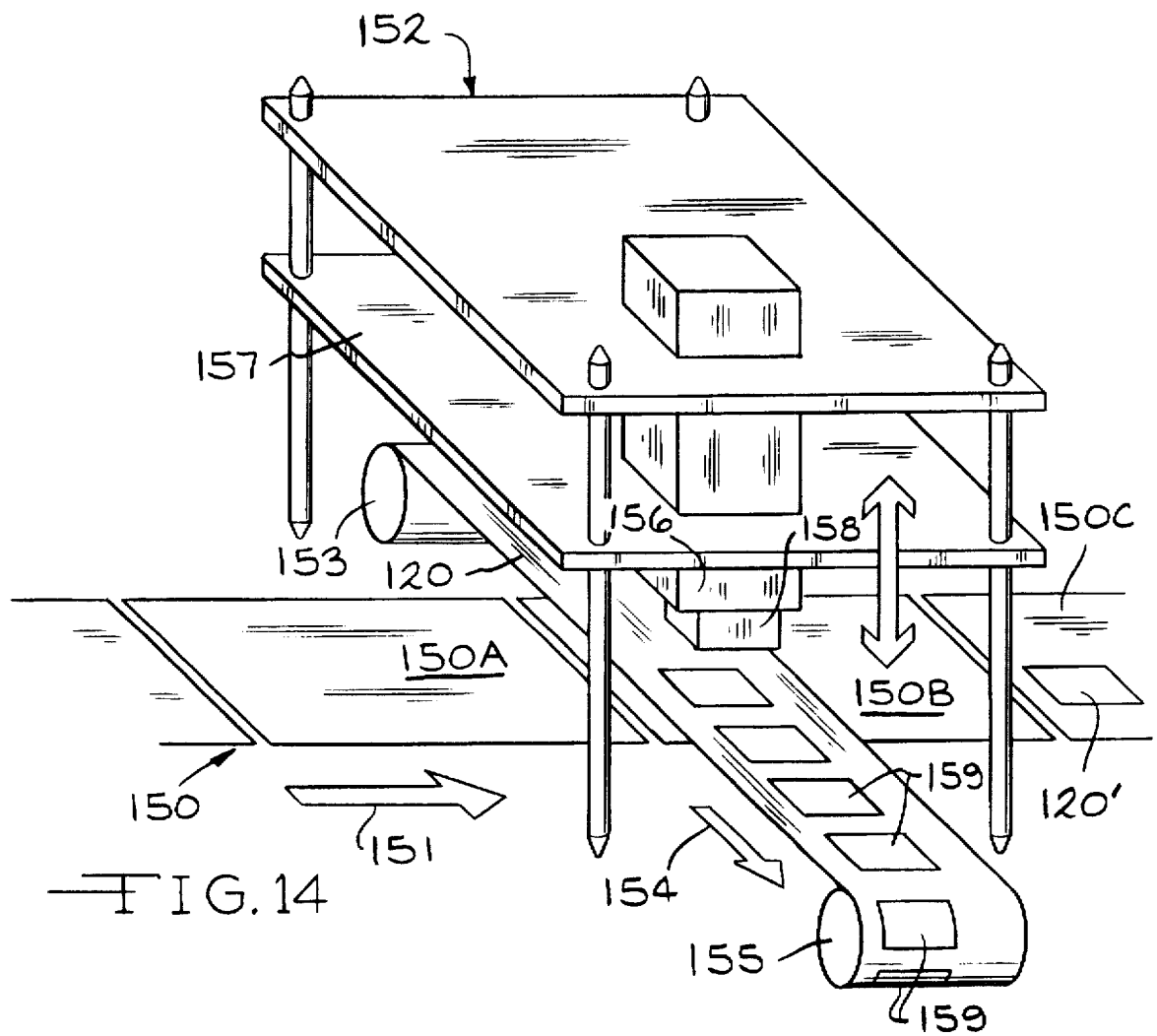
FIG. 14 is a schematic view showing apparatus for successively hot stamping small areas of the embossed composite sheet and adhesive to a printed substrate to form the final document of FIGS. 13 and 13A.

Referring now to FIG. 14, there is shown schematically one apparatus and process for successively hot stamping small areas of the embossed holographic composite sheet 120 to a document substrate 150 thereby leaving a small portion of the holographic composite sheet 120 which may be characterized as a chip 120' having an area the size of the stamping die adhered to the document substrate 150 to thereby form the final document. One such final document 150C' is shown in FIGS. 13 and 13A. As shown in FIGS. 13 and 13A, the document substrate 150C is provided with printing PR over which the chip 120' is adhered. As a result of the transparency, the printing PR may be viewed through the chip 120' and its holographic image.

As shown in FIG. 14, the document substrate 150 is a continuous strip containing a series of discrete, interconnected sections 150A, 150B and 150C, etc., and is fed along a horizontal path from a supply roll (not shown) to a take-off station (not shown). The sections 150A, 150B and 150C, etc., may have printing PR and constitute the major portions of finished documents to which a chip 120' having a holographic image or diffraction grating image embossed thereon is to be transferred and adhered.

The document substrate 150 may be formed of various types and qualities of paper, including papers coated with a wide variety of plastics or other materials, security paper or a film of plastic such as polyethyleneterephthalate, polyvinylchloride, oriented polypropylene, polyethylene, acetate or the like and, in order to achieve the benefit of the transparency of the composite sheet will have printing thereon. The interconnected sections 150A, 150B and 150C, etc., will be fed with the printing PR facing upward.

The continuous strip of document substrate 150 is fed in the generally horizontal path in a first direction denoted by the arrows 151 beneath a stamping station 152.

The holographic composite sheet 120 is fed from a supply roll 153 beneath the stamping station 152, over the document substrate 150 in closely adjacent relationship thereto. The holographic composite sheet 120 is fed in a second direction indicated by the arrow 154 at substantially a 90° angle to the first direction 151. The holographic composite sheet 120 is positioned with the heat activated adhesive coating G' contacting the document substrate 150 and the polyester or other plastic substrate A' facing up or away from the document substrate 150. The plastic substrate A' and the portions of the layers B', C', D', E', F' and G' of the holographic composite sheet 120 not transferred to the document substrate 150 are taken up by a take-up roll 155.

The stamping station 152 is provided with a hot stamping head 156 carrying a die 158 having a size and shape corresponding to the desired size and shape of the chip 120'. A flat support plate (not shown) is positioned immediately below the document substrate in a position aligned with the hot stamping head 156 and die 158. The hot stamping head 156 and die 158 are maintained at a temperature in the range of 75° C. to 250° C. and are mounted on a platform 157 for movement between a raised position shown in FIG. 14 and a lowered position. When the platform 157 is in a lowered position, the die 158 engages the holographic composite sheet on the plastic substrate A' side, heating it and the rest of the holographic composite sheet 120 to a temperature in the range of 75° C. to 250° C. and urging the holographic composite sheet 120 against the underlying section of document substrate 50 and against the support plate. In FIG. 14, the underlying section is 150B of the document substrate. Immediately prior to engagement of the die 158 against the plastic substrate A', the holographic composite sheet 120 and the continuous strip of document substrate 150 are caused to briefly stop, with movement resuming when the head 156 and die 158 are raised.

As a result of the heat and pressure to which the holographic composite sheet 120 and the successive sections of document substrate 150 are subjected by clamping between the die 158 and the support plate, a portion of the heat activated adhesive layer G' the size of the die is caused to become adhered to the specific section of the document substrate 150 so engaged, section 150B as shown in FIG. 14. At the same time, the heat causes a similarly sized portion of the release coating B' of the holographic composite sheet 120 to separate from the plastic substrate A' with the result that the section 150B of the document substrate 150 has affixed thereto a chip 120' portion of the holographic composite sheet 120 comprising the release coating B', the hard lacquer layer C', the soft lacquer coating D', the metal layer E', the embossment receiving layer F' and the heat activated adhesive G' (see FIG. 13) in a size corresponding to the size of the die 158. The die 158 is flat in order to provide substantially uniform heat and pressure to the underlying portion of the holographic composite sheet 120 and section 150B of the document substrate 150 during the stamping operation and thus ensure uniform adhesion of the adhesive layer G' to the section 50B' and successive sections and uniform release of the release coating B' from the plastic substrate A'. The hot stamping head 126 and die 128 should be maintained at a temperature in the range of 75° C. to 250° C. in order to bring the contacted portion of the holographic composite sheet 120 to such temperature range. As may be seen in FIG. 14, those portions of the plastic substrate A' and holographic composite sheet 120 which were subjected to heat and pressure by the die 158 appear as a series of windows 159 containing only the plastic substrate A' while the remaining portions being taken up by the take-up roll 155 consist of the plastic substrate A' and all other layers of the holographic composite sheet 120, namely, B', C', D', E', F and G'.

At an appropriate point after leaving the stamping station 152, the various sections of the document substrate, for example, section 150C with the chip 120' bearing the holographic image affixed thereto is cut or otherwise separated from the continuous strip of document substrate 150 thereby forming the final document 150C' shown in FIGS. 13 and 13A. Thus, the finished document 150C' includes section 150C of the document substrate 150 and the affixed chip 120' bearing the holographic image or diffraction grating image and comprising the release layer B', the hard lacquer coating C', the soft lacquer coating D', the metal layer E', the embossment receiving layer F' and the heat activated adhesive layer G' affixed to the document substrate section 150C. As in the previous embodiment, the printing PR on the document substrate may be viewed and read through the holograph or diffraction grating image.

Figure 15:
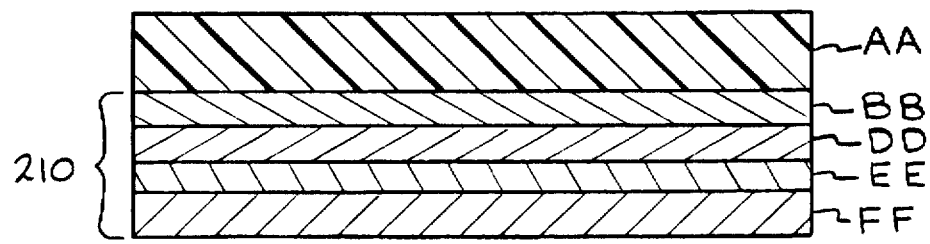
FIG. 15 is a schematic view showing a cross section of an embodiment of composite sheet affixed to a carrier film, which composite sheet has no layer of metal and may be used in applying the hologram or diffraction grating image directly to a substrate.
Figure 16:
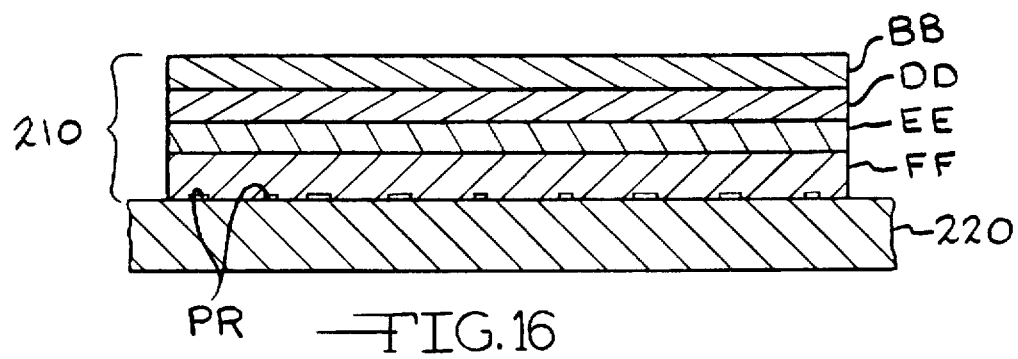
FIG. 16 is a view similar to FIG. 15 but showing the composite sheet without metal layer removed from the carrier film and adhered to the substrate of the intended finished document or other article.
Figure 17:
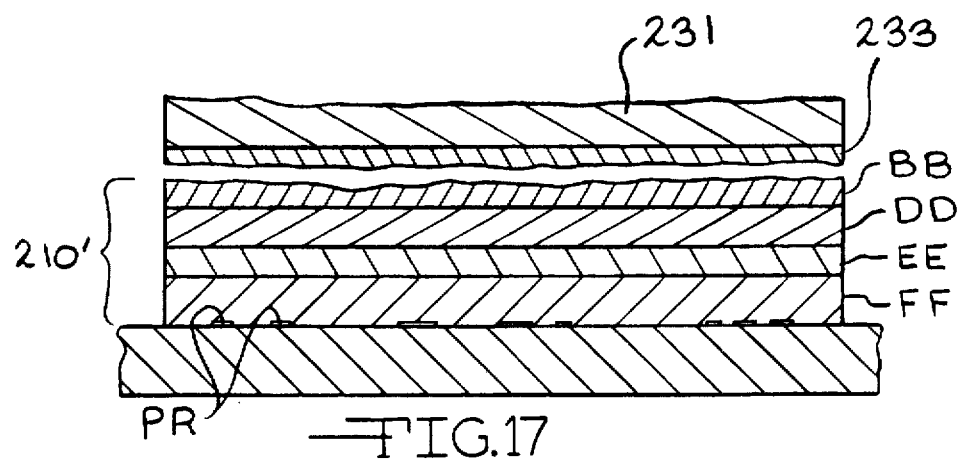
FIG. 17 is a schematic view showing a cross section of the finished article with the hologram or diffraction grating image from the composite sheet of FIG. 15 embossed in the surface opposite the substrate.

Referring now to FIG. 15 through 17, there is shown a further embodiment of composite sheet 210 which is identical to the composite sheet 10 of FIG. 1 with the exception that there is no layer of metal whatsoever. Thus, the composite sheet 210 comprises a release coating BB of wax such as a microcrystalline wax or a partially saponified montan wax or a siloxane having a thickness in the range of 0.025 microns to 1 microns. The release coating BB is applied to a film substrate AA having a thickness in the range of 12 microns to 50 microns and formed of a number of types of material including a film of polyester such as polyethyleneterephthalate or a film of biaxially oriented polypropylene, cellulose triacetate, polystyrene, polyethylene or polyvinylchloride.

A coating DD of lacquer such as acrylic, styrene acrylonitrile, polyethyleneterephthalate or nitrocellulose is applied to the release coating BB in a thickness in the range of 0.5 microns to 3 microns. The coating DD is preferably a thermo-softening lacquer applied from solution and containing acrylic and/or nitrocellulose and/or chlorinated rubber.

A tie coating EE is then applied to the lacquer coating DD. The tie coating EE is a material which is preferably the same type of material used for the lacquer coating DD but a much thinner layer. The tie coating EE has a thickness in the range of 0.05 microns to 0.2 microns.

The final coating for the composite sheet 210 is a heat activated adhesive coating FF which is formulated for its ability to adhere to the particular substrate to be used in the final document.

FIG. 16 shows schematically the construction following the next step of the method. In FIG. 16 there is shown the composite sheet 210 removed from the film substrate AA and adhered to a document substrate 220, with the heat activated adhesive coating FF facing and adhered to such document substrate 220. Removal of the film substrate AA leaves the composite sheet 210 with the release coating BB exposed. The document substrate 220 is shown as having printing PR thereon. In FIGS. 16 and 17, the printing PR is shown greatly exaggerated in order to illustrate its presence.

Referring to FIG. 17, a chip 210' from the composite sheet 210 adhered to the document substrate 220 forming the primary portion of the final document 225 has had embossed into the release coating BB, and lacquer coating DD the holographic image or diffraction pattern which has been embossed herein by a die or stamping head 231 carrying an embossing shim 233.

Figure 18:
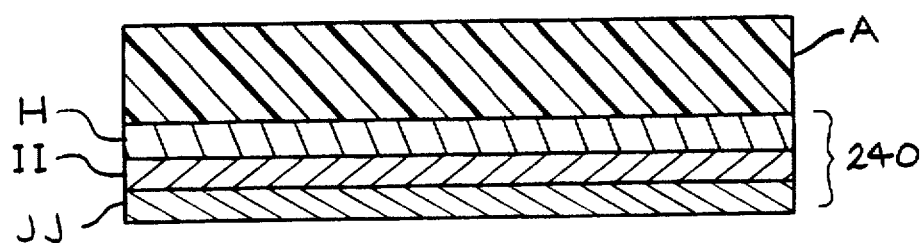
FIG. 18 is a schematic view showing a cross section of an another embodiment of composite sheet without metal layer affixed to a carrier film, which composite sheet may be used in applying the hologram or diffraction grating image directly to a substrate.

Referring now to FIG. 18, there is shown a further embodiment in which there is provided a film substrate AA and a composite sheet 240 having a slightly modified construction from the embodiment of composite sheet 210 shown in FIGS. 15-17. The construction of the composite sheet 240 is similar to that of the composite sheet 210 with the exception that there is no release coating between the film substrate to be released following application to the document and the metal layer. Thus, the composite sheet 240 consists of a coating HH of lacquer, a tie coating II and a layer JJ of heat activated adhesive.

Figure 19:
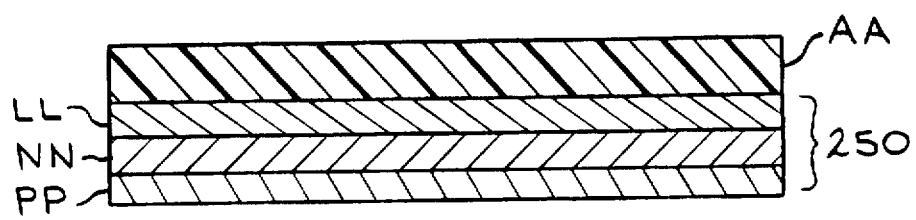
FIG. 19 is a view similar to FIG. 18 showing yet another embodiment of composite sheet without metal layer affixed to a carrier film.

Referring now to FIG. 19, there is shown another embodiment having a slightly different construction of composite sheet 250 affixed to the film substrate AA. This embodiment is similar to the embodiment of FIG. 15 with the exception that there is no tie coating between the lacquer coating and the heat activated adhesive. Thus, in the embodiment of FIG. 15, there is provided a film substrate AA to which the composite sheet 250 is affixed.

The composite sheet 250 includes a release coating LL of a wax or siloxane having a thickness in the range of 0.025 microns to 1 micron applied to the film substrate AA.

A coating NN of lacquer of the type previously described is applied to the release coating LL in a thickness in the range of 0.5 microns to 3 microns. Applied directly to the lacquer coating NN is a heat activated adhesive coating PP which, as in the previous embodiments, will vary depending upon the type of substrate to be used in the final document.

Figure 20:
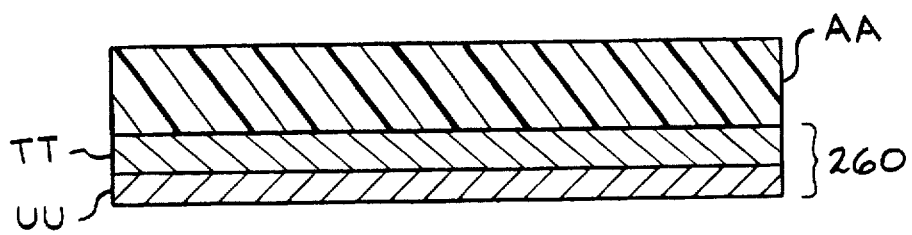
FIG. 20 is a view similar to FIG. 18 showing still another embodiment of composite sheet without metal layer affixed to a carrier film.

Referring now to FIG. 20, there is shown another embodiment of composite sheet 260 affixed to a film substrate AA. According to this embodiment, there is neither a release coating nor a tie coating. Thus, in the embodiment of FIG. 20, the composite sheet 260 comprises a lacquer coating TT such as that previously described which is applied directly to such film substrate AA. The lacquer coating TT has a thickness in the range of 0.5 to 3 microns. Applied directly to the lacquer coating TT is a heat activated adhesive coating UU.

Figure 21:
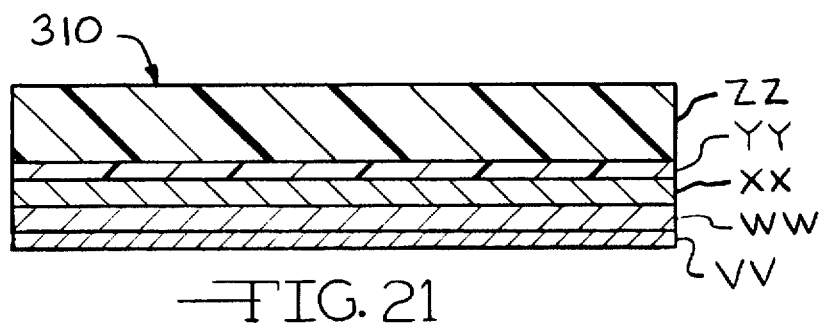
FIG. 21 is a view showing a further embodiment in which a composite sheet has no metal layer and has a structure suitable for having a holographic or diffraction grating image embossed into the embossment layer and the layer of soft lacquer.

Referring now to FIG. 21, there is shown a composite sheet 310 constructed according to another embodiment of the present invention, which composite sheet may have applied thereto a holographic image or other diffraction grating image. The composite sheet 310 comprises five layers including a support film substrate ZZ. The film substrate ZZ is similar to the film substrate A' of the embodiment of FIG. 10. A release coating YY of a wax such as a microcrystalline wax or a montan wax or a siloxane having a thickness in the range of 0.025 microns to 5 microns is applied to the film substrate ZZ.

A coating XX of a hard lacquer such as polymethyl methacrylate, styrene acrylonitrile, polyethyleneterephthalate or nitrocellulose is applied to the release coat YY in a thickness in the range of 0.5 microns to 5 microns.

A soft lacquer coating WW is then applied to the hard lacquer coating XX. The soft lacquer coating WW is a thermosoftening lacquer containing acrylic and/or nitrocellulose and/or chlorinated rubber. The soft lacquer coating WW has a thickness in the range of 0.5 microns to 5 microns and is the same as the soft lacquer coating D' of the embodiment of FIG. 10.

The final coating for the composite sheet 310 is an embossment receiving coating VV which has a thickness in the range of 0.025 micron to 1 micron and is the same as the embossment receiving coating F' in the embodiment of FIG. 10. The embossment receiving coating VV was applied to the soft lacquer WW of the partially formed composite sheet consisting of a polyester substrate ZZ, release coating YY, hard lacquer layer XX and soft lacquer layer WW.

The coating material used for the embossment receiving coating VV was also used for the release coating YY. However, the release coating could also be a siloxane or a microcrystalline wax.

Figure 22:
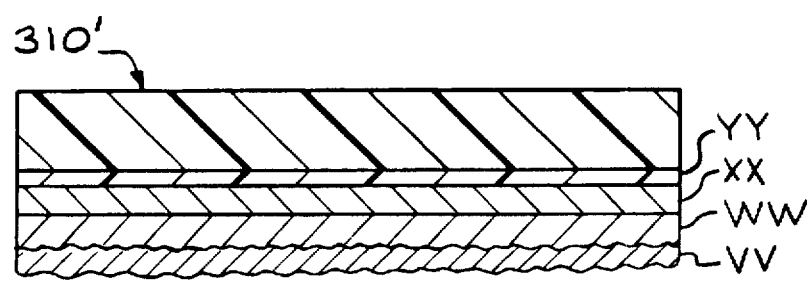
FIG. 22 is a view showing the composite sheet of FIG. 21 with a holographic image or diffraction grating image embossed into the embossment receiving layer and the layer of soft lacquer and showing an embossed metal shim spaced therefrom following the step of embossing the composite sheet.
Figure 22:
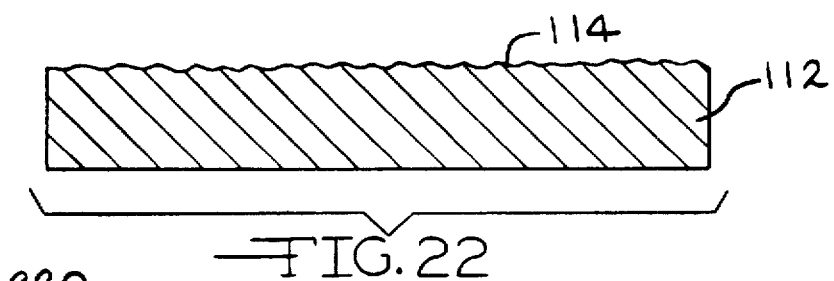

As shown schematically in FIG. 22, the composite sheet 310 as thus constructed has a holographic or diffraction grating image embossed into the embossment receiving coating VV and the soft lacquer WW to form the embossed composite sheet 310'. The embossing of such holographic image or diffraction grating image into the two layers consisting of the embossment receiving coating VV and the soft lacquer coating WW is accomplished by applying a nickel shim 112 or other suitable shim having a holographic or diffraction grating image 114 formed thereon. Such embossing is carried out under heat and pressure with the shim being applied to the embossment receiving coating VV side of the composite sheet 310. Desirably, the shim 112 will be maintained at a temperature in the range of 100° C. to 250° C. and preferably about 175° C. and applied to the composite sheet 310 under a pressure of 200 to 400 pounds per linear inch with the result that the holographic or diffraction grating image will extend into the embossment receiving layer VV and the soft lacquer coating WW thereby forming an embossed composite sheet 310'. The shim 112 may be maintained at a temperature in the range of 100° C. to 250° C. The application pressure may be in the range of 200 to 400 pounds per linear inch. With the embossing step being performed under the above temperature and pressure parameters, the layer of hard lacquer XX will serve to insulate and thereby prevent activation of the release coating YY with the result that the substrate ZZ will remain adhered to the remaining layers of the embossed composite sheet 310' and not be prematurely separated therefrom.

Figure 23:
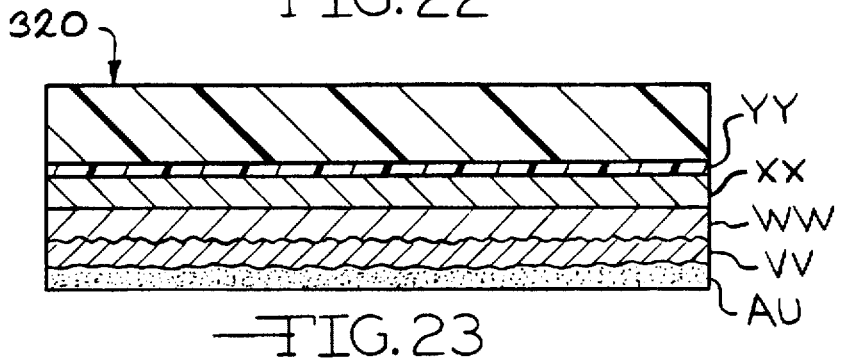
FIG. 23 is a sectional view of the embossed composite sheet of FIG. 22 with a heat activated adhesive coating applied to the embossment receiving layer.

Thereafter, as may be seen in FIG. 23, a coating of heat activated adhesive AU is applied over the embossment receiving coating VV and the embossed holographic or diffraction grating image. The heat activated adhesive coating UU serves a dual function of protecting the embossed holographic or diffraction grating image and functioning, at a later time, to adhere a chip from the embossed composite sheet 310' bearing the holographic or diffraction grating image to a desired substrate. The application of the heat activated adhesive coating completes the construction of a final holographic composite sheet 320.

Figure 24:
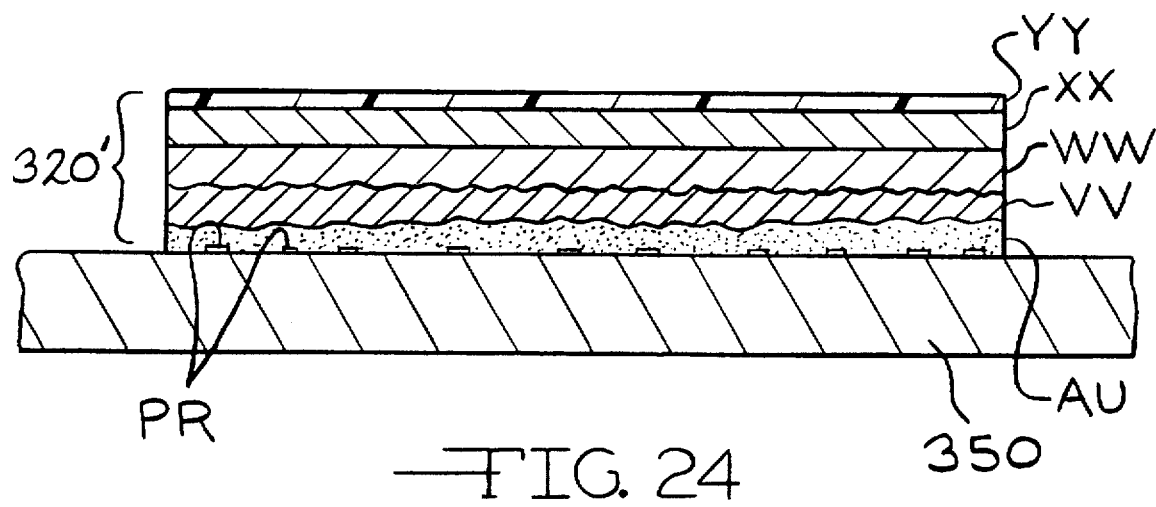
FIG. 24 is a sectional view showing the structure of a final document having a chip from the composite sheet and adhesive of FIG. 23 adhered thereto.

An apparatus and process for hot stamping small areas of the embossed holographic composite sheet 320 to a substrate 350 to form a final embossed document 350' could be one similar to that previously described with reference to FIG. 14 and will not be repeated here. The final document shown in FIG. 24, includes a substrate 350 to which is adhered a chip 320' which has been transferred from the embossed holographic sheet 320 and released from the support film substrate ZZ and includes the wax release coat YY, the hard lacquer XX, the soft lacquer WW, the embossment receiving coating VV and the adhesive UU which is adhered over the surface of the document substrate 350 having the printing PR. Since there is no layer of metal whatsoever in the embodiment of FIGS. 21 through 24, the printing PR on the substrate 350 will be more readily visible than in those embodiments having a metal layer; however, it is still possible to clearly view the holographic image which has been embossed in the embossment receiving coating VV and the soft lacquer layer WW.

Many modifications will become readily apparent to those skilled in the art. Accordingly, the scope of the present invention should be determined only by the scope of the appended claims.

I claim:

1. A document comprising:
   (a) a substrate having printing on a first surface;
   (b) a composite structure adhered to said substrate first surface, said composite structure including,
      (i) a lacquer coating having a thickness in the range of 0.5 microns to 3 microns, and
      (ii) an adhesive coating having a thickness in the range of 0.75 microns to 4 microns securing said lacquer coating to said substrate first surface; and
   (c) a holographic image or diffraction grating image embossed in said lacquer coating, said holographic image or diffraction grating image being embossed after said composite structure is adhered to said substrate, said printing being visible through said holographic image or diffraction grating image.

2. The document of claim 1, further including a layer of metal on said lacquer coating, said layer of metal having a thickness resulting in optical density in the range of 0.10 to 0.50 units as measured by Macbeth densitometer and having said holographic image or diffraction grating image embossed therein.

3. The document of claims 1 or 2, wherein said lacquer coating is a member of the group consisting of acrylic, styrene-acrylonitrile polymer, polyester and nitrocellulose.

4. The document of claims 1 or 2, wherein said adhesive is a heat activatible adhesive.

5. The document of claim 2, further including a coating of wax or siloxane having a thickness in the range of 0.025 microns to 1 micron on said layer of metal opposite said lacquer coating.

6. The document of claim 1, further including a second lacquer coating between said lacquer coating and said adhesive coating, said second lacquer coating having a thickness in the range of 0.05 microns to 0.2 microns, said second lacquer coating being a member of the group consisting of acrylic, styrene-acrylonitrile polymer, polyester and nitrocellulose.

7. A document comprising:
(a) an opaque substrate having printing on a first surface;
(b) a composite sheet adhered to said first surface, said composite sheet including
  (i) a coating of adhesive having a thickness in the range of 0.75 microns to 4 microns adjacent said first surface,
  (ii) an embossment receiving coating having a thickness in the range of 0.025 micron to 1 micron affixed to said coating of adhesive, said embossment receiving coating being an esterified montan wax,
  (iii) a coating of soft lacquer having a thickness in the range of 0.5 microns to 5 microns affixed to said embossment receiving coating, said soft lacquer having a glass transition temperature no higher than 70° C., and
  (iv) a coating of hard lacquer having a thickness in the range of 0.5 microns to 5 microns affixed to said coating of soft lacquer, said hard lacquer having a glass transition temperature of at least 80° C.; and
(c) said embossment receiving coating and said soft lacquer coating having embossed therein a holographic image or diffraction grating image, said printing being visible through said holographic image or diffraction grating image.

8. The document of claim 7, further including a release coating on said hard lacquer coating.

9. The document of claim 7, wherein said embossment receiving coating includes esterified montan wax combined with aluminum stearate, toluene and cellulose.

10. The document of claim 7, wherein said coating of soft lacquer is a member selected from the group consisting of acrylic, nitrocellulose and chlorinated rubber.

11. The document of claim 10, wherein said coating of hard lacquer is a member selected from the group consisting of polymethyl methacrylate, styrene acrylonitrile, polyethyleneterephthalate and nitrocellulose.

12. A document comprising:
(a) a thermoplastic substrate having printing on a first surface;
(b) a composite sheet adhered to said first surface, said composite sheet including
  (i) a coating of adhesive having a thickness in the range of 0.75 microns to 4 microns adjacent said first surface,
  (ii) an embossment receiving coating having a thickness in the range of 0.025 micron to 1 micron affixed to said coating of adhesive, said embossment receiving coating being an esterified montan wax,
  (iii) a layer of metal having a thickness resulting in an optical density in the range of 0.10 to 0.50 units as measured by Macbeth Densitometer affixed to said embossment receiving coating,
  (iv) a coating of soft lacquer having a thickness in the range of 0.5 microns to 5 microns affixed to said layer of metal, said soft lacquer having a glass transition temperature no higher than 70° C., and
  (v) a coating of hard lacquer having a thickness in the range of 0.5 microns to 5 microns affixed to said coating of soft lacquer, said hard lacquer having a glass transition temperature of at least 80° C.; and
(c) said embossment receiving coating, said layer of metal and said soft lacquer coating having embossed therein a holographic image or diffraction grating image, said printing being visible through said holographic image or diffraction grating image.

13. A document according to claim 12, further including a release coating on said hard lacquer coating.

14. The document according to claim 12, wherein said embossment receiving coating includes esterified montan wax combined with aluminum stearate, toluene and cellulose.

15. The document of claim 12, wherein said coating of soft lacquer is a member selected from the group consisting of acrylic, nitrocellulose and chlorinated rubber.

16. The document of claim 15, wherein said coating of hard lacquer is a member selected from the group consisting of polymethyl methacrylate, styrene acrylonitrile, polyethyleneterephthalate and nitrocellulose.

17. A composite sheet comprising:
(a) a thermoplastic substrate;
(b) a release coating having a thickness of 0.025 microns to 5 microns affixed to said thermoplastic substrate;
(c) a coating of hard lacquer having a thickness in the range of 0.5 microns to 5 microns affixed to said release coating, said hard lacquer having a glass transition temperature of at least 80° C.;
(d) a coating of soft lacquer having a thickness in the range of 0.5 microns to 5 microns affixed to said hard lacquer coating, said soft lacquer having a glass transition temperature no higher than 70° C.; and
(e) an embossment receiving coating having a thickness in the range of 0.025 micron to 1 micron affixed to said coating of soft lacquer, said embossment receiving coating being an esterified montan wax, said embossment receiving coating and said soft lacquer coating having embossed therein a holographic image or diffraction grating image, said thermoplastic substrate being releasable from the remainder of said composite sheet, said remainder being transparent.

18. The composite sheet of claim 17, further including a layer of metal between said soft lacquer coating and said embossment receiving coating, said layer of metal having a thickness resulting in an optical density in the range of 0.10 to 0.50 units as measured by Macbeth Densitometer.

19. The composite sheet of claim 17, wherein said embossment receiving coating includes esterified montan wax combined with aluminum stearate, toluene and cellulose.

20. The composite sheet of claim 17, further including a coating of heat activatible adhesive having a thickness in the range of 0.75 microns to 4 microns affixed to said embossed embossment receiving coating.

21. The composite sheet of claim 17, wherein said coating of soft lacquer is a member selected form the group consisting of acrylic, nitrocellulose and chlorinated rubber.

22. The composite sheet of claim 21, wherein said coating of hard lacquer is a member selected from the group consisting of polymethyl methacrylate, styrene acrylonitrile, polyethyleneterephthalate and nitrocellulose.

* * * * *